(12) United States Patent
Plekhanov et al.

(10) Patent No.: US 8,987,859 B2
(45) Date of Patent: Mar. 24, 2015

(54) TECHNIQUES FOR ENHANCING DIELECTRIC BREAKDOWN PERFORMANCE

(71) Applicant: Intel Corporation, Santa Clara, CA (US)

(72) Inventors: Pavel S. Plekhanov, Hillsboro, OR (US); Kevin J. Fischer, Hillsboro, OR (US); Qiang Fu, Beaverton, OR (US); Hiroki Hiramatsu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 13/693,602

(22) Filed: Dec. 4, 2012

(65) Prior Publication Data

US 2014/0151889 A1  Jun. 5, 2014

(51) Int. Cl.
  *H01L 21/70* (2006.01)
  *H01L 23/48* (2006.01)
  *H01L 21/768* (2006.01)
  *H01L 23/522* (2006.01)
  *H01L 23/532* (2006.01)

(52) U.S. Cl.
  CPC ............ *H01L 23/48* (2013.01); *H01L 21/768* (2013.01); *H01L 21/76801* (2013.01); *H01L 23/5222* (2013.01); *H01L 23/5329* (2013.01); *H01L 2924/0002* (2013.01)
  USPC ............ 257/508; 257/629; 257/640; 438/404

(58) Field of Classification Search
  CPC ............... H01L 21/76801; H01L 21/76802; H01L 23/5222; H01L 23/5329
  USPC ................. 257/629, 640, 508; 438/404
  See application file for complete search history.

(56) References Cited

U.S. PATENT DOCUMENTS

| | | | | |
|---|---|---|---|---|
| 6,153,933 A | * | 11/2000 | Chan et al. | 257/752 |
| 2005/0156285 A1 | * | 7/2005 | Gates et al. | 257/632 |
| 2008/0102599 A1 | * | 5/2008 | Yang | 438/430 |
| 2010/0025852 A1 | * | 2/2010 | Ueki et al. | 257/761 |
| 2010/0044869 A1 | * | 2/2010 | Zhang et al. | 257/773 |

* cited by examiner

*Primary Examiner* — Kimberly Rizkallah
*Assistant Examiner* — Maria Ligai
(74) *Attorney, Agent, or Firm* — Finch & Maloney PLLC

(57) ABSTRACT

Techniques are disclosed for enhancing the dielectric breakdown performance of integrated circuit (IC) interconnects. The disclosed techniques can be used to selectively etch the dielectric layer of an IC to form a recess, for example, between a given pair of adjacent/neighboring interconnects (e.g., metal lines). Thereafter, a layer of dielectric material of higher dielectric breakdown field ($E_c$) than the surrounding/underlying dielectric material (or other suitable insulator, as will be apparent in light of this disclosure) may be deposited/grown so as to substantially conform to the topology provided by the adjacent/neighboring interconnects and etched recess. In some cases, this dielectric layer may help to prevent or otherwise reduce: (1) dielectric breakdown between the adjacent/neighboring interconnects by locally increasing the dielectric breakdown voltage ($V_{BD}$); and/or (2) diffusion of the interconnect fill metal into the surrounding/underlying dielectric material. In some instances, such a layer may serve as an etch stop.

23 Claims, 6 Drawing Sheets

TECHNIQUES FOR ENHANCING DIELECTRIC BREAKDOWN PERFORMANCE

BACKGROUND

Integrated circuit (IC) design in the deep-submicron process nodes (e.g., 32 nm and beyond) involves a number of non-trivial challenges, and IC interconnect structures have faced particular complications. Continued process scaling will tend to exacerbate such problems.

BRIEF DESCRIPTION OF THE DRAWINGS

FIG. 2D' is a cross-section view of an IC 100 after deposition of a dielectric layer, in accordance with another embodiment of the present invention.

Figure 1:
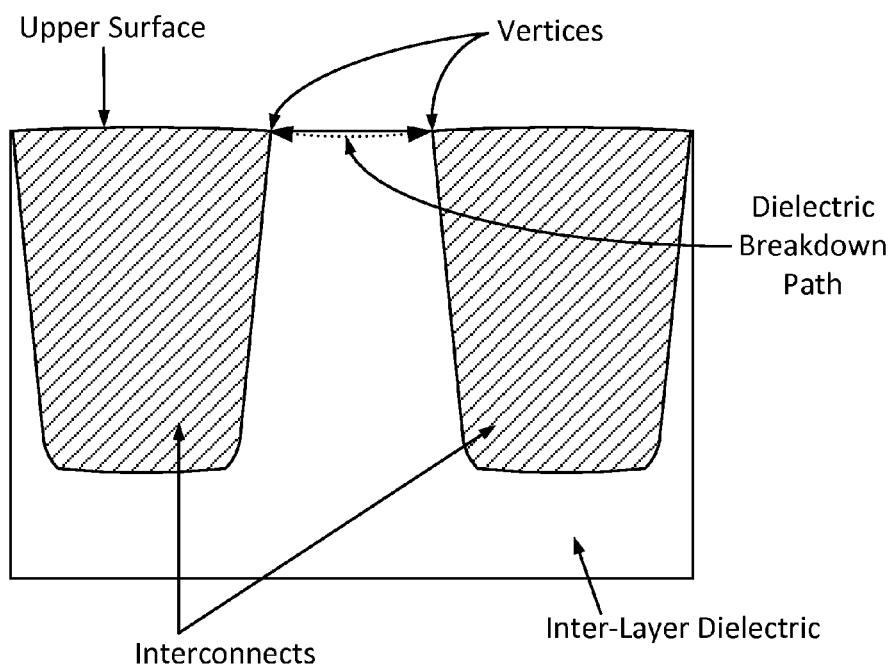
FIG. 1 is a cross-section view of two interconnects running parallel with one another within the same dielectric layer of an example integrated circuit.

As will be appreciated, the figures are not necessarily drawn to scale or intended to limit the claimed invention to the specific configurations shown. For instance, while some figures generally indicate straight lines, right angles, and smooth surfaces, an actual implementation of a given embodiment may have less than perfect straight lines, right angles, etc., and some features may have surface topology or otherwise be non-smooth, given real world limitations of integrated circuit (IC) fabrication. In short, the figures are provided merely to show example structures. In the drawings, each identical or nearly identical component that is illustrated in various figures may be represented by a like numeral. For purposes of clarity, not every component may be labeled in every drawing. These and other features of the present embodiments will be understood better by reading the following detailed description, taken together with the figures herein described.

DETAILED DESCRIPTION

Techniques are disclosed for enhancing the dielectric breakdown performance of integrated circuit (IC) interconnects. The disclosed techniques can be used to selectively etch the dielectric layer of an IC to form a recess, for example, between a given pair of adjacent/neighboring interconnects (e.g., metal lines). Thereafter, a layer of dielectric material of higher dielectric breakdown field ($E_c$) than the surrounding/underlying dielectric material (or other suitable insulator, as will be apparent in light of this disclosure) may be deposited/grown so as to substantially conform to the topology provided by the adjacent/neighboring interconnects and etched recess. In some cases, this dielectric layer may help to prevent or otherwise reduce: (1) dielectric breakdown between the adjacent/neighboring interconnects by locally increasing the dielectric breakdown voltage ($V_{BD}$); and/or (2) diffusion of the interconnect fill metal into the surrounding/underlying dielectric material. In some instances, such a layer may serve as an etch stop. Numerous configurations and variations will be apparent in light of this disclosure.

General Overview

As previously indicated, there are a number of non-trivial issues that can arise which complicate integrated circuit (IC) design. For instance, one non-trivial issue pertains to the fact that as the dimensions of IC interconnects decrease, complications related to dielectric breakdown generally increase. For instance, consider FIG. 1, which is a cross-section view of two interconnects running parallel with one another within the same dielectric layer of an example IC. As will be appreciated in light of this disclosure, by virtue of the generally trapezoidal shape of these interconnects, the intensity of the electric field is highest around the vertices of the longer base (e.g., the upper surface) of the trapezoid. In addition, the upper vertices of these interconnects generally have the highest curvature, which further locally increases the electric field proximate the vertices. Thus, the inter-layer dielectric near/between the vertices is most prone to dielectric breakdown, and the most likely path of dielectric breakdown between the two interconnects is generally indicated by the dotted, two-headed arrow in the figure.

One possible approach to addressing dielectric breakdown between adjacent IC interconnects involves providing sufficient spacing there between. However, this approach results in a lower layout density of IC interconnects and imposes undesirable design constraints. Another possible approach might involve using an inter-layer dielectric (ILD) which has a high dielectric breakdown field ($E_c$) value and thus can withstand higher intensity electric fields before dielectric breakdown occurs. However, such inter-layer dielectrics also typically have a high dielectric constant ($\kappa$), which results in higher line-to-line capacitance and greater RC delay. Yet another possible approach might involve depositing a planar layer of a high-$\kappa$, high-$E_c$ dielectric material on the planar surface provided by the ILD and its interconnects. However, as will be appreciated in light of this disclosure, with this approach a critical dielectric breakdown path within the ILD remains open (e.g., as noted above with reference to FIG. 1).

Thus, and in accordance with an embodiment of the present invention, techniques are disclosed for enhancing the dielectric breakdown performance of integrated circuit (IC) interconnects. In accordance with an embodiment, the disclosed techniques can be used to selectively etch the dielectric layer of an IC (e.g., an inter-layer dielectric, ILD, or other insulating layer) to form a recess, for example, between a given pair of adjacent/neighboring interconnects (e.g., metal lines) provided in the IC. Thereafter, a substantially conformal layer comprising a dielectric material, for example, of higher dielectric breakdown field ($E_c$) than the surrounding/underlying dielectric material may be locally deposited/grown on the topology provided by the adjacent/neighboring interconnects and etched recess. In accordance with an embodiment, this dielectric layer may substantially encapsulate (e.g., fully enclose or otherwise cover within an acceptable tolerance) the regions of the adjacent/neighboring interconnects of highest electric field intensity (e.g., the vertices of the higher curvature surfaces of the interconnects). By virtue of such encapsulation, the dielectric layer may locally increase the dielectric breakdown voltage ($V_{BD}$) and thus help to eliminate or otherwise reduce/inhibit the dielectric breakdown path which otherwise would be present in the ILD between the interconnects. Thus, and in accordance with an embodiment, the disclosed techniques may be used to help minimize or otherwise reduce dielectric breakdown between adjacent/neighboring interconnects in an IC, and thus enhance the overall dielectric breakdown performance of the IC.

Some embodiments of the present invention may allow for the interconnect geometry in a given IC to remain substantially unchanged, which in turn may increase line-to-line voltage without significantly affecting line-to-line capacitance due to increased dielectric constant ($\kappa$). Also, some embodiments of the present invention may help to improve the long-term reliability of IC interconnects. For instance, in some embodiments, the high-$E_c$ dielectric layer may be relatively sufficiently denser and further provide a substantially hermetic etch stop layer that encapsulates interface points most likely to be susceptible to breakdown. Furthermore, in some embodiments, the dielectric layer may help to prevent or otherwise reduce diffusion of the interconnect fill metal (e.g., copper or other suitable fill metal) into the surrounding/underlying dielectric layer (e.g., ILD).

Some embodiments of the present invention may realize an increase in mean breakdown voltage in the range of about 20-60% or greater (e.g., about 20-40% or greater; about 40-60% or greater; etc.), for example, as compared with existing structures. Also, some embodiments of the present invention may realize an increase in minimum breakdown voltage in the range of about 40-80% or greater (e.g., about 40-50% or greater; about 50-60% or greater; about 60-70% or greater; about 70-80% or greater; etc.), for example, as compared with existing structures.

The disclosed techniques can be used, in some example cases, in the fabrication of a wide range of interconnect structures (e.g., inter-chip interconnects; intra-chip interconnects; conductive metal lines; vias; etc.) that may be implemented in a wide range of electronic components/devices. For instance, some embodiments of the present invention can be used in devices and/or applications which may benefit from having high interconnect density (e.g., logic, memory, etc.). Also, some embodiments can be utilized, for example, in IC fabrication in the deep-submicron process nodes (e.g., 32 nm and beyond; 22 nm node and beyond; 14 nm node and beyond; 10 nm node and beyond; etc.). Other suitable uses of the disclosed techniques will depend on a given application and will be apparent in light of this disclosure.

As will be further appreciated in light of this disclosure, and in accordance with an embodiment, use of the techniques disclosed herein may be detected, for example, by visual or other inspection (e.g., microscope, etc.) and/or materials analysis of a given IC or other device that has interconnect structures having critical or otherwise likely breakdown points substantially encapsulated by a layer of high-$E_c$ dielectric material configured as described herein.

Methodology and Structure

FIGS. 2A-2E illustrate an integrated circuit (IC) fabrication process flow in accordance with an embodiment of the present invention. The process flow may begin as in FIG. 2A, which is a cross-section view of an integrated circuit (IC) 100 provided with one or more patterned features 112, in accordance with an embodiment of the present invention. As can be seen, IC 100 may include a layer of insulator material (e.g., an inter-layer dielectric or ILD) 110. In accordance with an embodiment, the disclosed techniques can be implemented with any of a wide variety of ILD 110 insulator materials (e.g., low-$\kappa$, high-$\kappa$, or otherwise). For instance, in some example embodiments, the disclosed techniques can be used with an ILD 110 comprising one or more of: (1) an oxide such as silicon dioxide ($SiO_2$), silicon oxide (SiO), carbon-doped $SiO_2$, etc.; (2) a nitride such as silicon nitride ($Si_3N_4$), etc.; (3) a polymer such as perfluorocyclobutane ($C_4F_8$), polytetrafluoroethylene (PTFE), etc.; (4) a phosphosilicate glass (PSG); (5) a fluorosilicate glass (FSG); (6) an organosilicate glass (OSG) such as silsesquioxane, siloxane, etc.; (7) a combination of any of the aforementioned; and/or (8) any other suitable dielectric material, as will be apparent in light of this disclosure. In one example embodiment, ILD 110 may comprise a low-$E_c$, low-$\kappa$ dielectric material such as, but not limited to, carbon-doped $SiO_2$ having a carbon concentration in the range of about 0% to 30% or greater (e.g., about 15-30% or greater; about 20-25% or greater; etc.). In some cases, ILD 110 may be deposited, as desired, on a substrate, wafer, or other suitable surface. As will be appreciated in light of this disclosure, any of a wide range of suitable deposition techniques may be utilized, such as, but not limited to: (1) physical vapor deposition (PVD); (2) chemical vapor deposition (CVD); and/or (3) spin-on deposition (SOD). As will be further appreciated, ILD 110 may be provided with any given thickness, as desired for a given target application or end-use. Other suitable configurations, materials, concentration ranges, deposition techniques, and/or thicknesses for ILD 110 will depend on a given application and will be apparent in light of this disclosure.

As previously noted, and as can be seen from FIG. 2A, ILD 110 may have patterned therein one or more features 112, for example, for providing IC 100 with one or more interconnects 120 (discussed below with reference to FIG. 2B). Patterning of ILD 110 may be performed using any suitable lithography technique (e.g., wet etch, dry etch, polishing, cleans, etc.), as will be appreciated in light of this disclosure. In some cases in which ILD 110 comprises an oxide material, for example, a dry etch process utilizing a fluorine (F)-based etch chemistry (e.g., carbon tetrafluoride or $CF_4$; etc.) may be used to provide the one or more patterned features 112. Other suitable etch techniques and/or chemistries will depend on a given application and will be apparent in light of this disclosure.

As will be further appreciated, and in accordance with an embodiment, the disclosed techniques may be compatible with any of a wide variety of interconnects 120, including, but not limited to: (1) dual-damascene structures (e.g., a trench with an underlying via); (2) single-damascene structures; (3) anisotropic structures; (4) isotropic structures; and/or (5) any other desired IC structures, interconnects or otherwise. The dimensions of a given patterned feature 112 (and thus of a given resultant interconnect 120) may be customized as desired for a given target application or end-use.

Figure 2A:
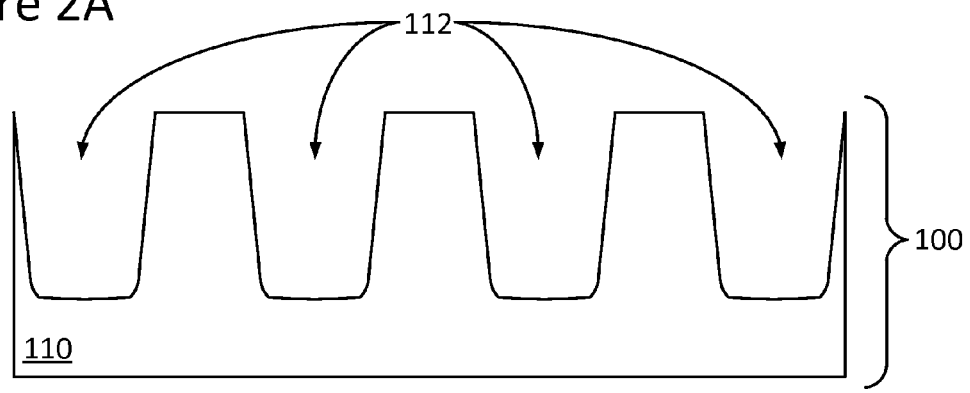
FIG. 2A is a cross-section view of an integrated circuit (IC) provided with one or more patterned features, in accordance with an embodiment of the present invention.
Figure 2B:
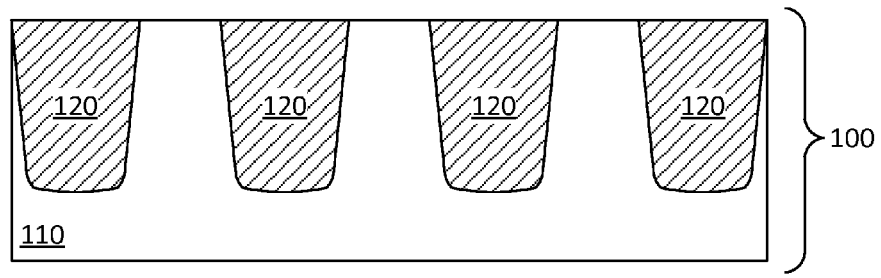
FIG. 2B is a cross-section view of the IC of FIG. 2A after deposition of a fill metal and planarization, in accordance with an embodiment of the present invention.

The process flow may continue as in FIG. 2B, which is a cross-section view of the IC 100 of FIG. 2A after deposition of a fill metal and planarization, in accordance with an embodiment of the present invention. As can be seen, the one or more patterned features 112 of ILD 110 may be filled, in part or in whole, with a fill metal to provide one or more interconnects 120. In accordance with an embodiment, any of a wide variety of deposition processes can be used to fill, including, but not limited to: (1) electroplating; (2) electroless deposition; (3) chemical vapor deposition (CVD); and/or (4)

any other fill technique/process suitable for metallization (e.g., back-end and/or front-end) of an IC, as will be apparent in light of this disclosure. In some cases, the interconnect fill metal can be directly deposited on ILD 110 without any intermediate material layers (e.g., seed layer, adhesion layer, etc.). However, the claimed invention is not so limited, as in some other example instances, one or more intermediate layers (e.g., such as optional intermediate layer 115, discussed below in the context of FIG. 3) optionally may be deposited between ILD 110 and the fill metal of a given interconnect 120, if so desired. In accordance with an embodiment, the interconnect fill metal may comprise an electrically conductive metal, such as, but not limited to: (1) copper (Cu); (2) silver (Ag); (3) aluminum (Al); (4) gold (Au); (5) an alloy of any of the aforementioned; and/or (6) any other suitably electrically conductive metal, as will be apparent in light of this disclosure.

As previously noted, IC 100 can be polished or otherwise planarized, if desired. To that end, and in accordance with an embodiment, IC 100 may undergo a chemical-mechanical planarization (CMP) process or any other suitable polishing/planarization technique/process, as will be apparent in light of this disclosure. Planarization of IC 100 may be performed, for instance, to remove any undesired excess of: (1) a given interconnect 120 (e.g., such as may be present from overfilling a given patterned feature 112 with a given fill metal); (2) ILD 110; and/or (3) any optionally included intermediate layer (e.g., such as optional intermediate layer 115, discussed below).

Figure 2C:
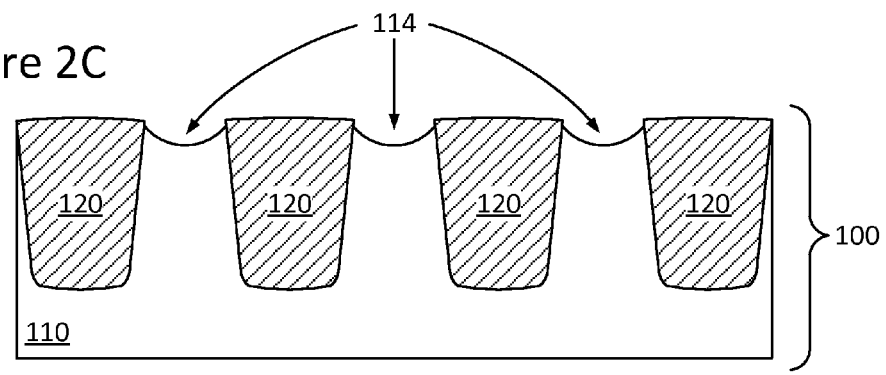
FIG. 2C is a cross-section view of the IC of FIG. 2B after etching thereof, in accordance with an embodiment of the present invention.

Next, the process flow may continue as in FIG. 2C, which is a cross-section view of the IC 100 of FIG. 2B after etching thereof, in accordance with an embodiment of the present invention. As can be seen, ILD 110 may be etched to form one or more recesses 114, for example, between adjacent/neighboring interconnects 120. Formation of recesses 114 may be done, for example, using any suitable lithography technique (e.g., masking, wet etch, dry etch, polishing, cleans, etc.), as will be appreciated in light of this disclosure. In accordance with an embodiment, the etch process may be customized (e.g., in duration, chemistry, type, etc.) to produce recesses 114 of a desired degree of isotropy (e.g., isotropic, anisotropic, etc.) and/or dimensions (e.g., depth from the plane of ILD 110 and interconnects 120; tapered/angled walls; etc.). As will be appreciated in light of this disclosure, the one or more recesses 114 may be of sufficiently small dimensions such that the bulk of ILD 110 remains substantially unchanged, and thus the line-to-line capacitance of IC 100 is minimally or otherwise negligibly increased.

Also, as will be appreciated in light of this disclosure, it may be desirable to utilize an etch chemistry which is selective to etching the dielectric material of ILD 110 (e.g., as opposed to the fill metal of interconnects 120). For instance, in some cases in which interconnects 120 include a copper (Cu) fill metal, some example suitable etch processes and chemistries for etching ILD 110 to provide the one or more recesses 114 may include, but are not limited to: (1) a wet etch process utilizing a fluorine (F)-based etch chemistry (e.g., hydrofluoric acid or HF; dilute HF; etc.); and/or (2) a dry etch process utilizing a fluorine (F)-based etch chemistry (e.g., argon with nitrogen trifluoride; etc.). By utilizing an etch chemistry that is selective to etching ILD 110, in accordance with some embodiments, the fill metal of interconnects 120 may be minimally or otherwise negligibly affected such that the geometry of the one or more interconnects 120 remains substantially unchanged, and thus the line-to-line voltage of IC 100 is minimally or otherwise negligibly reduced. Some other embodiments may mask off interconnects 120 to protect them during the etching of ILD 110. In some example cases, the etch process provides one or more concave or otherwise bowl-like recesses 114 having a maximum depth in the range of about 1-50 nm, although any number of shapes/geometries and/or dimensions (e.g., depths) of a given recess 114 may be provided. Other suitable etch techniques and/or chemistries will depend on a given application and will be apparent in light of this disclosure.

Figure 2D:
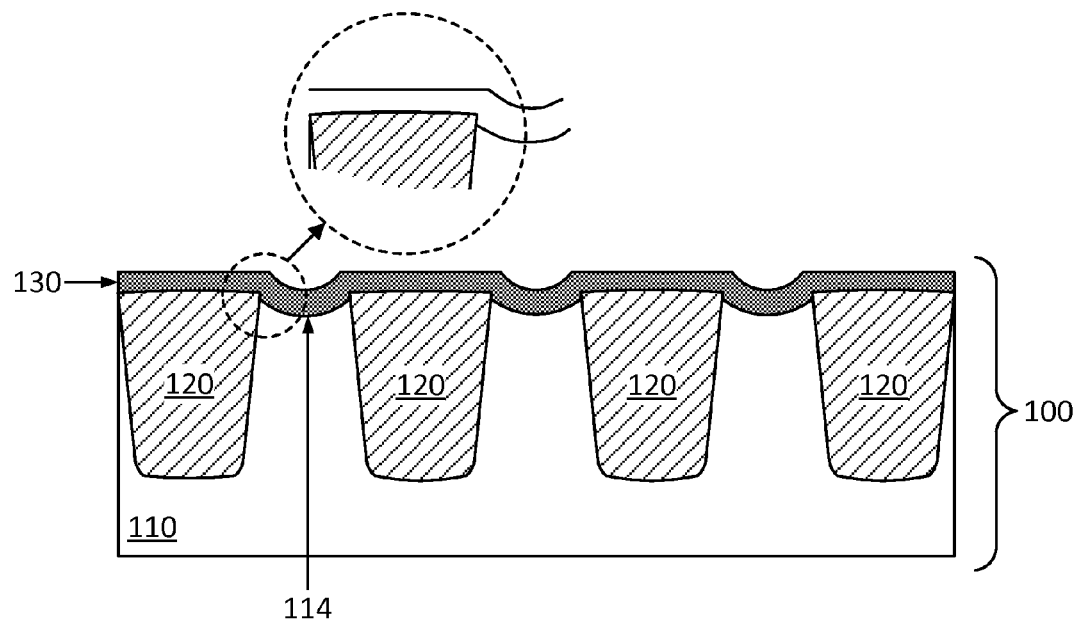
FIG. 2D is a cross-section view of the IC of FIG. 2C after deposition of a dielectric layer, in accordance with an embodiment of the present invention.
Figure 2D:
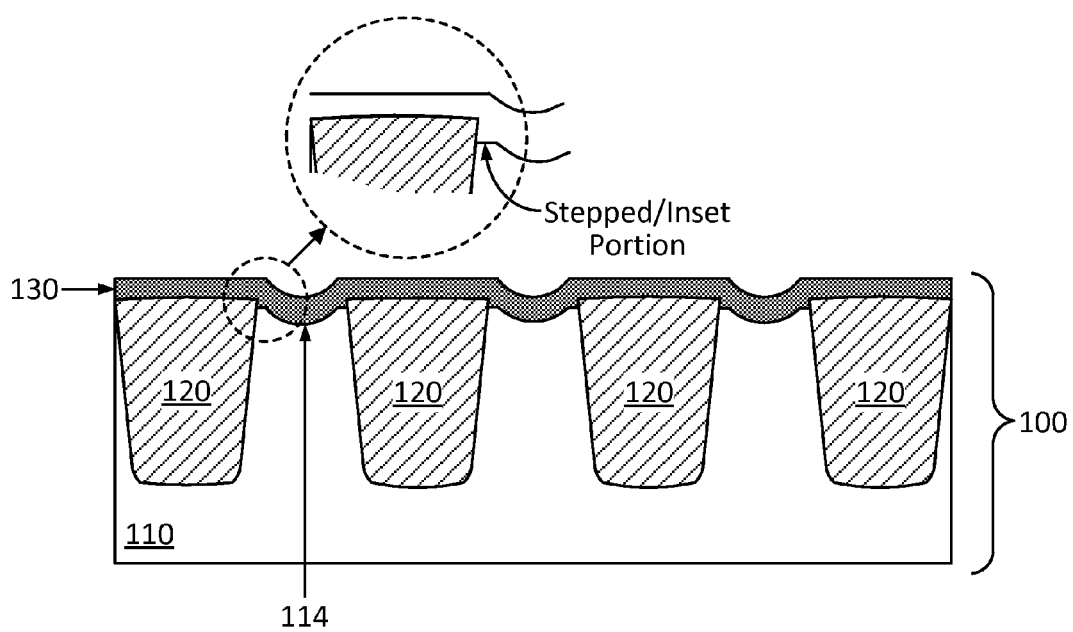

Thereafter, the process flow may continue as in FIG. 2D, which is a cross-section view of the IC 100 of FIG. 2C after deposition of a dielectric layer 130, in accordance with an embodiment of the present invention. As previously noted, IC 100 may be provided with a layer 130 of dielectric material disposed proximate its one or more interconnects 120. As can be seen from the example embodiment of FIG. 2D, dielectric layer 130 may be deposited locally as a substantially conformal layer which covers the topology provided by ILD 110 (e.g., the one or more recesses 114 formed therein) and the one or more interconnects 120. As will be appreciated in light of this disclosure, and in accordance with an embodiment, dielectric layer 130 can be deposited using any of a wide variety of deposition techniques/processes which may include, but are not limited to: (1) chemical vapor deposition (CVD) (e.g., plasma-enhanced CVD); (2) atomic layer deposition (ALD); and/or (3) any other suitable dielectric deposition process, as will be apparent in light of this disclosure. As will be further appreciated in light of this disclosure, dielectric layer 130 may be referred to herein as an etch stop layer in some embodiments, but such labeling is not intended to limit the claimed invention. Rather, dielectric layer 130 may be any suitable insulator having qualities as described herein and need not necessarily serve as an etch stop.

In accordance with an embodiment, dielectric layer 130 may be deposited as a layer/film ranging from the thickness of a single constituent atom (i.e., a monolayer) to as thick a layer/film as desired for a given application. For instance, in some example embodiments, dielectric layer 130 can be deposited with a thickness in the range of about 1-100 nm or greater (e.g., in the range of about 5-40 nm or greater, or any other sub-range within the range of about 1-100 nm). In some cases, dielectric layer 130 may have a substantially uniform thickness over such topology. However, the claimed invention is not so limited, as in some other instances, dielectric layer 130 may be provided with a non-uniform or otherwise varying thickness over such topology. For instance, in some cases a first portion of dielectric layer 130 may have a thickness within a first range while a second portion thereof has a thickness within a second, different range. Other suitable configurations and/or thickness ranges for dielectric layer 130 will depend on a given application and will be apparent in light of this disclosure.

In accordance with an embodiment, dielectric layer 130 may comprise a dielectric material, for example, which exhibits: (1) a higher dielectric breakdown field ($E_c$) than the material(s) implemented in ILD 110; and/or (2) a higher dielectric constant (x) than the material(s) implemented in ILD 110. Some example suitable high-$E_c$ dielectric materials may include, but are not limited to: (1) silicon nitride ($Si_3N_4$); (2) silicon carbide (SiC); (3) silicon carbon nitride (SiCN); (4) silicon carbon oxynitride (SiCON); (5) a combination of any of the aforementioned; and/or (6) any other suitable high-$E_c$ dielectric material, as will be apparent in light of this disclosure.

As previously noted, dielectric layer 130 may be deposited/grown on IC 100, for example, as a dense, substantially hermetic etch stop layer (e.g., fully hermetic or otherwise within a desired tolerance) which substantially conforms to the topology of the one or more recesses 114 (and the one or more interconnects 120) and thus encapsulates/encloses the locations (denoted by regions 121) of the interconnects 120 having the highest electric field. In some cases, dielectric layer 130 may be substantially conformal to a given recess 114, which recess 114 may be characterized by an isotropic and/or anisotropic profile/geometry (e.g., as a result of the etch process utilized). As a result of such encapsulation, dielectric layer 130 may eliminate or otherwise reduce/inhibit the dielectric breakdown path which otherwise would be present in the lower-$E_c$ ILD 110 between a given pair of adjacent interconnects 120 (e.g., dielectric layer 130 may disallow a vertex-to-vertex breakdown path through ILD 110). Thus, and in accordance with an embodiment, the dielectric layer 130 may serve to locally increase the dielectric breakdown voltage ($V_{BD}$) and thus help to minimize or otherwise reduce dielectric breakdown, for example, between regions 121 of adjacent interconnects 120, thereby improving the dielectric breakdown performance of IC 100. Also, by virtue of such encapsulation, dielectric layer 130 may help to prevent or otherwise limit diffusion of the fill metal (e.g., Cu, etc.) of a given interconnect 120 into the surrounding ILD 110. Therefore, and in accordance with an embodiment, dielectric layer 130 may help, in some cases, to improve long-term reliability of the interconnects 120 of a given IC 100 (e.g., against gradual, long-term degradation of dielectric properties under the influence of electric field leading to eventual dielectric breakdown).

However, the claimed invention is not so limited. For instance, consider FIG. 2D', which is a cross-section view of an IC 100 after deposition of a dielectric layer 130, in accordance with another embodiment of the present invention. As can be seen here, the one or more recesses 114 may be formed in ILD 110 such that dielectric layer 130 extends further down the side of a given interconnect 120, further encapsulating a given vertex thereof. In some embodiments, a given recess 114 may have one or more stepped/inset portions (e.g., as can be seen, for instance, from comparing the enlarged views enclosed by the dashed circles in FIGS. 2D and 2D'), and dielectric layer 130 may be provided so as to conform to such recess geometry. Numerous configurations will be apparent in light of this disclosure.

Figure 2E:
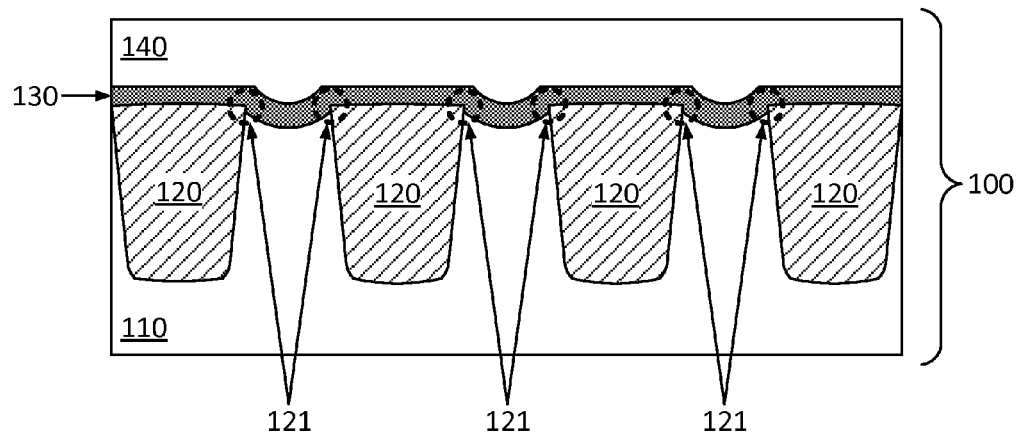
FIG. 2E is a cross-section view of the IC of FIG. 2D after deposition of an insulator material, in accordance with an embodiment of the present invention.

Next, the process flow may continue as in FIG. 2E, which is a cross-section view of the IC 100 of FIG. 2D after deposition of an insulator material (e.g., an inter-layer dielectric or ILD) 140, in accordance with an embodiment of the present invention. As will be appreciated in light of this disclosure, and in accordance with an embodiment, the discussion provided above with reference to FIG. 2A regarding the materials of ILD 110 and/or suitable deposition techniques (e.g., discussed in the example context of optionally depositing ILD 110 on a substrate) applies equally here in the context of ILD 140. As can be seen from FIG. 2E, ILD 140 may be deposited on IC 100 such that it substantially conforms to the topology provided by dielectric layer 130 (e.g., which may substantially conform to the topology provided by ILD 110, recesses 114, and interconnects 120). Note that in some embodiments, ILD 140 may be the same material as dielectric layer 130, and therefore just be an extended dielectric layer 130.

Figure 3:
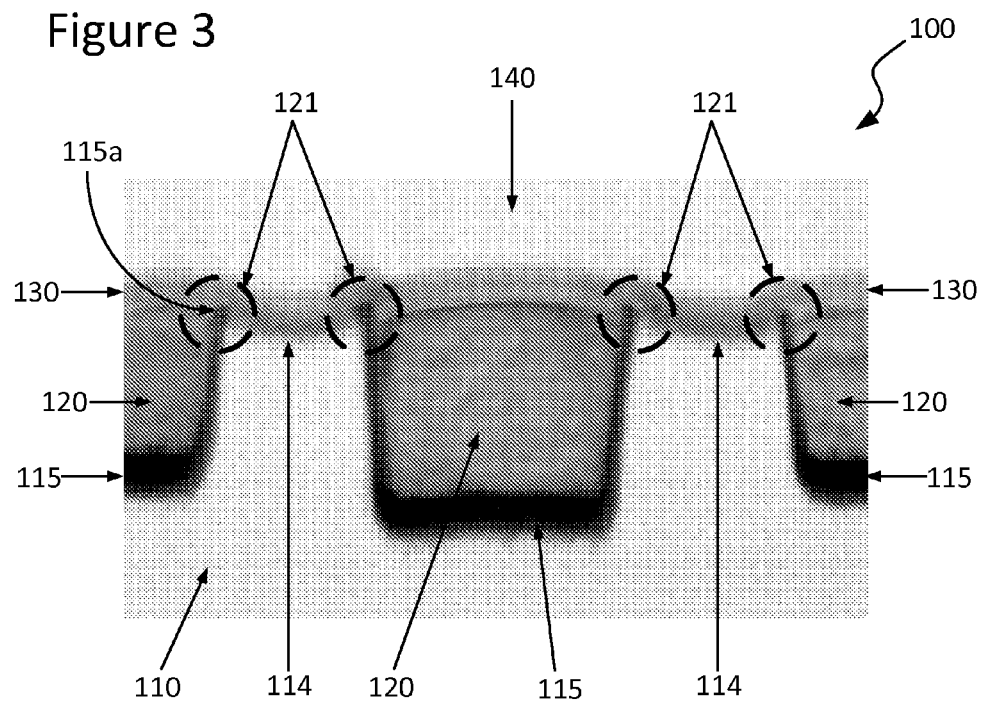
FIG. 3 is a cross-sectional transmission electron microscope (TEM) image of an integrated circuit (IC) configured in accordance with an embodiment of the present invention.

FIG. 3 is a cross-sectional transmission electron microscope (TEM) image of an integrated circuit (IC) 100 configured in accordance with an embodiment of the present invention. As can be seen, IC 100 includes an ILD 110 having a plurality of interconnects 120 provided therein, and a dielectric layer 130 that has been deposited/grown, in accordance with an embodiment, over the topology provided by recesses 114 formed in ILD 110 and the interconnects 120. As can further be seen, in some cases IC 100 may include an optional intermediate layer 115 disposed, for example, between the fill metal of a given interconnect 120 and the surrounding ILD 110. In some example embodiments, the optional intermediate layer 115 may be a barrier/film and/or liner comprising a material such as, but not limited to, tantalum (Ta) and/or titanium (Ti). In some other example embodiments, the optional intermediate layer 115 may be a bi-layer barrier/film and/or liner comprising materials such as, but not limited to: (1) a tantalum nitride (TaN) barrier layer and a tantalum (Ta) adhesion layer (i.e., forming a TaN/Ta stack); and/or (2) a titanium nitride (TiN) barrier layer and a titanium (Ti) adhesion layer (i.e., forming a TiN/Ti stack). As will be appreciated in light of this disclosure, the TaN (or TiN) barrier layer in a bi-layer configuration may help to prevent or otherwise reduce diffusion of the fill metal (e.g., Cu, etc.) into the surrounding/underlying ILD 110, while the Ta (or Ti) adhesion layer may provide nucleation, wetting, and adhesion, for instance, for a subsequently deposited fill metal seed layer (e.g., Cu, etc.), if desired. As will be further appreciated, optional intermediate layer 115 can be deposited using any of a wide range of techniques/process, such as, but not limited to, a physical vapor deposition (PVD)/sputtering process, and may have any desired thickness. Other suitable configurations, materials, and/or deposition processes for a given optional intermediate layer 115 will depend on a given application and will be apparent in light of this disclosure.

In some instances in which an optional intermediate layer 115 is implemented, one or more protrusions 115a (e.g., the projections seen in regions 121 of FIG. 3) may be present in IC 100. As will be appreciated in light of this disclosure, such protrusions 115a may be artifacts of the etch process noted above, for example, with regard to FIG. 2C in the context of etching ILD 110 to form one or more recesses 114. As will be further appreciated, adjustment of the etch process may result in more or less pronounced protrusions 115a, and in some cases protrusions 115a may be wholly or otherwise substantially eliminated.

Example Implementation Data

Figure 4:
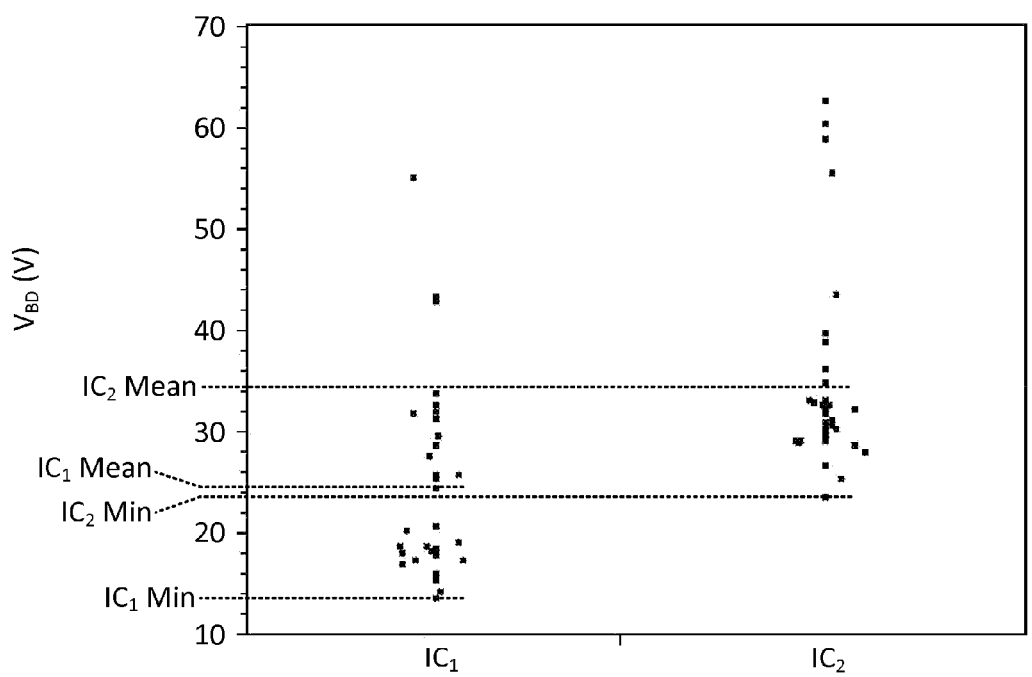
FIG. 4 is a graph of experimental data showing dielectric breakdown voltage ($V_{BD}$) for an integrated circuit manufactured using an existing technique compared with the dielectric breakdown voltage for an example integrated circuit configured in accordance with an embodiment of the present invention.

FIG. 4 is a graph of experimental data showing dielectric breakdown voltage ($V_{BD}$) for an integrated circuit manufactured using an existing technique compared with the dielectric breakdown voltage for an example integrated circuit (IC) 100 configured in accordance with an embodiment of the present invention. The tested samples collectively labeled as 'IC$_1$' on the left side of the graph correspond with a series of similarly designed ICs prepared using existing techniques/approaches. As can be seen, the mean $V_{BD}$ for IC$_1$ is 24.2 V, and the minimum $V_{BD}$ for IC$_1$ is 13.7 V. Conversely, the tested samples collectively labeled as 'IC$_2$' on the right side of the graph correspond with a series of similarly designed ICs 100 configured in accordance with an embodiment of the present invention. As can be seen, the mean $V_{BD}$ for IC$_2$ is 34.2 V, and the minimum $V_{BD}$ for IC$_2$ is 23.7 V. Also, the data plots of FIG. 4 effectively show that an IC 100 which has been etched to include one or more recesses 114 and which has had a dielectric layer 130 deposited thereon, in accordance with an embodiment, may exhibit: (1) an increase in mean breakdown voltage in the range of about 20-60% or greater (e.g., about 20-40% or greater; about 40-60% or greater; etc.); and/or (2) an increase in minimum breakdown voltage in the range of about 40-80% or greater (e.g., about 40-50% or greater; about 50-60% or greater; about 60-70% or greater; about 70-80% or greater; etc.). Thus, as will be appreciated in light of this disclosure, the disclosed techniques can be used, in some example cases, to provide an IC interconnect structure that is more stable against dielectric breakdown than existing designs/structures.

Example System

Figure 5:
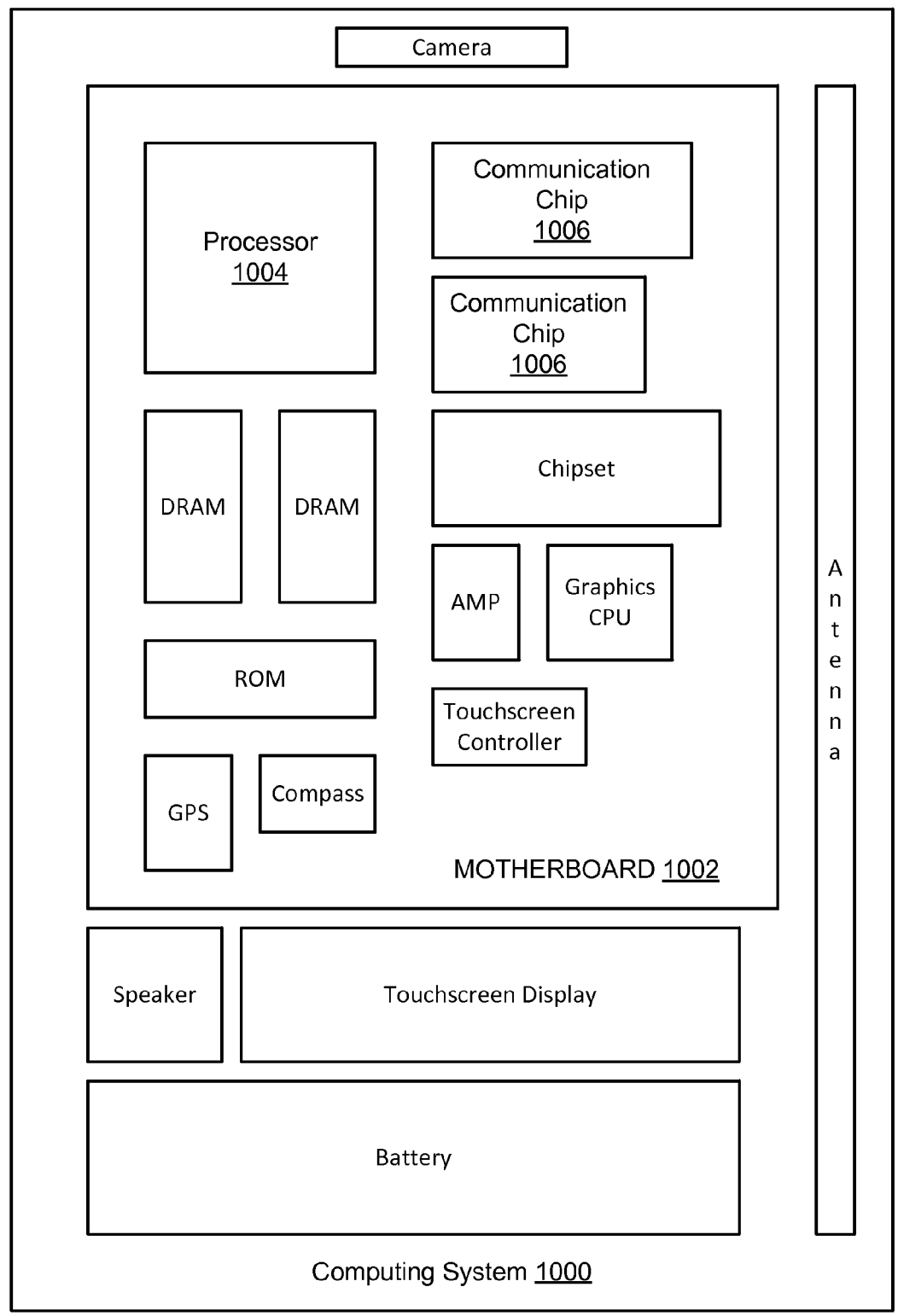
FIG. 5 illustrates a computing system implemented with integrated circuit (IC) structures or devices formed by one or more of the dielectric breakdown performance enhancement techniques disclosed herein, in accordance with an example embodiment of the present invention.

FIG. 5 illustrates a computing system 1000 implemented with integrated circuit (IC) structures or devices formed by one or more of the dielectric breakdown performance enhancement techniques disclosed herein, in accordance with an example embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more IC structures or devices formed by using one or more of the dielectric breakdown performance enhancement techniques disclosed herein, in accordance with an example embodiment of the present invention. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard circuitry that is implemented with one or more IC structures or devices formed by using one or more of the dielectric breakdown performance enhancement techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more IC structures or devices formed by using one or more of the dielectric breakdown performance enhancement techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more IC structures or devices formed by implementing one or more of the dielectric breakdown performance enhancement techniques, as variously described herein.

Numerous embodiments will be apparent in light of this disclosure. One example embodiment of the present invention provides an integrated circuit including a first dielectric layer having formed therein a first interconnect, a second interconnect adjacent to the first interconnect, and a recess positioned between the first and second interconnects, and a second dielectric layer deposited over a topology formed by the recess and the first and second interconnects, wherein the second dielectric layer comprises a material of higher dielectric breakdown field ($E_c$) than the first dielectric layer. In some cases, the first dielectric layer comprises carbon-doped silicon dioxide (C-doped $SiO_2$) having a carbon concentration in the range of about 0% to 30%. In some example instances, at least one of the first and/or second interconnects comprises at least one of copper (Cu), silver (Ag), aluminum (Al), gold (Au), and/or an alloy of any of the aforementioned. In some cases, the second dielectric layer comprises at least one of silicon nitride ($Si_3N_4$), silicon carbide (SiC), silicon carbon nitride (SiCN), silicon carbon oxynitride (SiCON), and/or a combination of any of the aforementioned. In some instances, the second dielectric layer is conformal to the topology. In some cases, a first portion of the second dielectric layer has a first thickness and a second portion of the second dielectric layer has a second thickness that is different from the first thickness. In some example instances, the second dielectric layer has a thickness in the range of about 1-100 nm. In some cases, the second dielectric layer encapsulates high-electric field points of the first and second interconnects so as to inhibit a voltage breakdown path there between through the first dielectric layer. In some instances, the second dielectric layer provides a hermetic seal for at least one of the first and/or second interconnects. In some cases, at least one of the first and/or second interconnects comprises an electrically conductive metal, and wherein the second dielectric layer reduces diffusion of the electrically conductive metal into the first dielectric layer. In some instances, the second dielectric layer serves as an etch stop layer. In some embodiments, the integrated circuit further includes an intermediate layer disposed between the first dielectric layer and at least one of the first and/or second interconnects. In some such embodiments, the intermediate layer comprises at least one of tantalum (Ta), titanium (Ti), tantalum nitride (TaN), and/or titanium nitride (TiN). In some embodiments, the integrated circuit further includes a third dielectric layer deposited over a topology formed by the second dielectric layer.

Another example embodiment of the present invention provides a method of forming an integrated circuit, the method including providing a first dielectric layer having formed therein a plurality of interconnects, wherein the plurality of interconnects includes at least a first interconnect and a second interconnect, etching the first dielectric layer to form a plurality of recesses therein, wherein the plurality of recesses includes at least a first recess formed between the first and second interconnects, and depositing a second dielectric layer over a topology formed by the plurality of recesses and the plurality of interconnects, wherein the second dielectric layer comprises a dielectric material of higher dielectric breakdown field ($E_c$) than the first dielectric layer. In some embodiments, the method further includes depositing a third dielectric layer over the second dielectric layer, wherein the first and third dielectric layers comprise a similar dielectric material. In some embodiments, the method further includes planarizing the first dielectric layer and the plurality of interconnects prior to etching the first dielectric layer to form the plurality of recesses therein. In some such embodiments, planarizing the first dielectric layer and the plurality of interconnects includes using a chemical-mechanical planarization (CMP) process. In some embodiments, etching the first dielectric layer to form the plurality of recesses therein includes using an etch process utilizing fluorine (F)-based etch chemistry. In some cases, an integrated circuit formed by the method is provided. In some such cases, an electronic device including such an integrated circuit is provided.

Another example embodiment of the present invention provides an integrated circuit including a first dielectric layer having formed therein a plurality of copper (Cu) interconnects and a plurality of recesses, wherein each recess of the plurality of recesses is formed between a different pair of adjacent interconnects of the plurality of interconnects, and a second dielectric layer deposited over a topology formed by the plurality of recesses and the plurality of interconnects, wherein the second dielectric layer comprises a material of higher dielectric breakdown field ($E_c$) than the first dielectric layer, reduces diffusion of the copper (Cu) into the first dielectric layer, and reduces dielectric breakdown between adjacent interconnects.

Another example embodiment of the present invention provides an integrated circuit interconnect including an insulator structure and first and second metal features partially within the insulator structure. The first and second metal features each have a portion at least partially protruding beyond a surface of the insulator structure. The interconnect further includes a continuous, conformal insulation layer on the insulator structure and covering the portions of the first and second metal features at least partially protruding beyond the surface of the insulator structure, such that the conformal insulation layer fully encloses vertices of the protruding portions of the first and second metal features.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An integrated circuit comprising:
   a first dielectric layer having formed therein:
      a first interconnect;
      a second interconnect adjacent to the first interconnect; and
      a concave recess positioned between the first and second interconnects;
      the first and second interconnects each having a portion at least partially protruding beyond a surface of the first dielectric layer; and
   a second dielectric layer deposited over a topology formed by the recess and the first and second interconnects, wherein the second dielectric layer comprises a material of higher dielectric breakdown field ($E_c$) than the first dielectric layer.

2. The integrated circuit of claim 1, wherein the first dielectric layer comprises carbon-doped silicon dioxide (C-doped $SiO_2$) having a carbon concentration in the range of about 0% to 30%.

3. The integrated circuit of claim 1, wherein at least one of the first and second interconnects comprises at least one of copper (Cu), silver (Ag), aluminum (Al), gold (Au), and an alloy of any of the aforementioned.

4. The integrated circuit of claim 1, wherein the second dielectric layer comprises at least one of silicon nitride ($Si_3N_4$), silicon carbide (SiC), silicon carbon nitride (SiCN), silicon carbon oxynitride (SiCON), and a combination of any of the aforementioned.

5. The integrated circuit of claim 1, wherein the second dielectric layer is conformal to the topology.

6. The integrated circuit of claim 1, wherein a first portion of the second dielectric layer has a first thickness and a second portion of the second dielectric layer has a second thickness that is different from the first thickness.

7. The integrated circuit of claim 1, wherein the second dielectric layer has a thickness in the range of about 1-100 nm.

8. The integrated circuit of claim 1, wherein the second dielectric layer encapsulates high-electric field points of the first and second interconnects so as to inhibit a voltage breakdown path there between through the first dielectric layer.

9. The integrated circuit of claim 1, wherein the second dielectric layer provides a hermetic seal for at least one of the first and second interconnects.

10. The integrated circuit of claim 1, wherein at least one of the first and second interconnects comprises an electrically conductive metal, and wherein the second dielectric layer reduces diffusion of the electrically conductive metal into the first dielectric layer.

11. The integrated circuit of claim 1, wherein the second dielectric layer serves as an etch stop layer.

12. The integrated circuit of claim 1 further comprising an intermediate layer disposed between the first dielectric layer and at least one of the first and second interconnects.

13. The integrated circuit of claim 12, wherein the intermediate layer comprises at least one of tantalum (Ta), titanium (Ti), tantalum nitride (TaN), and titanium nitride (TiN).

14. The integrated circuit of claim 1 further comprising a third dielectric layer deposited over a topology formed by the second dielectric layer.

15. The integrated circuit of claim 1, wherein the concave recess has a depth in the range of about 1-50 nm.

16. The integrated circuit of claim 1, wherein the concave recess has a stepped/inset portion.

17. A method of forming an integrated circuit, the method comprising:
provproviding a first dielectric layer having formed therein a plurality of interconnects, wherein the plurality of interconnects includes at least a first interconnect and a second interconnect;
etching the first dielectric layer to form a plurality of recesses therein, wherein the plurality of recesses includes at least a first concave recess formed between the first and second interconnects; and
depositing a second dielectric layer over a topology formed by the plurality of recesses and the plurality of interconnects, wherein the second dielectric layer comprises a dielectric material of higher dielectric breakdown field ($E_c$) than the first dielectric layer.

18. The method of claim 17 further comprising depositing a third dielectric layer over the second dielectric layer, wherein the first and third dielectric layers comprise a similar dielectric material.

19. The method of claim 17 further comprising planarizing the first dielectric layer and the plurality of interconnects prior to etching the first dielectric layer to form the plurality of recesses therein.

20. The method of claim 19, wherein planarizing the first dielectric layer and the plurality of interconnects comprises using a chemical-mechanical planarization (CMP) process.

21. The method of claim 17, wherein etching the first dielectric layer to form the plurality of recesses therein comprises using an etch process utilizing fluorine (F)-based etch chemistry.

22. An integrated circuit comprising:
a first dielectric layer having formed therein a plurality of copper (Cu) interconnects and a plurality of recesses including at least one concave recess, wherein each recess of the plurality of recesses is formed between a different pair of adjacent interconnects of the plurality of interconnects; and
a second dielectric layer deposited over a topology formed by the plurality of recesses and the plurality of interconnects, wherein the second dielectric layer:
comprises a material of higher dielectric breakdown field ($E_c$) than the first dielectric layer;
reduces diffusion of the copper (Cu) into the first dielectric layer; and
reduces dielectric breakdown between adjacent interconnects.

23. An integrated circuit interconnect comprising:
an insulator structure having a concave recess formed therein;
first and second metal features partially within the insulator structure, the first and second metal features each having a portion at least partially protruding beyond a surface of the insulator structure, wherein the concave recess is positioned between the first and second metal features; and
a continuous, conformal insulation layer on the insulator structure and covering the concave recess and the portions of the first and second metal features at least partially protruding beyond the surface of the insulator structure, such that the conformal insulation layer fully encloses vertices of the protruding portions of the first and second metal features.

* * * * *